United States Patent
Yamamoto et al.

(10) Patent No.: US 9,273,387 B2
(45) Date of Patent: Mar. 1, 2016

(54) MEMBER COVERED WITH HARD COATING

(75) Inventors: Kenji Yamamoto, Kobe (JP); Yoshiro Iwai, Fukui (JP); Jun Munemasa, Takasago (JP)

(73) Assignee: Kobe steel, Ltd., Kobe-shi (JP)

( * ) Notice: Subject to any disclaimer, the term of this patent is extended or adjusted under 35 U.S.C. 154(b) by 2 days.

(21) Appl. No.: 14/119,339

(22) PCT Filed: Jun. 15, 2012

(86) PCT No.: PCT/JP2012/065394
§ 371 (c)(1),
(2), (4) Date: Nov. 21, 2013

(87) PCT Pub. No.: WO2012/173236
PCT Pub. Date: Dec. 20, 2012

(65) Prior Publication Data
US 2014/0200132 A1    Jul. 17, 2014

(30) Foreign Application Priority Data

Jun. 17, 2011 (JP) ................................. 2011-135401

(51) Int. Cl.
*C23C 14/06* (2006.01)
*C23C 14/32* (2006.01)
*C23C 30/00* (2006.01)
*F01D 5/28* (2006.01)

(52) U.S. Cl.
CPC ......... *C23C 14/0641* (2013.01); *C23C 14/0664* (2013.01); *C23C 14/325* (2013.01); *C23C 30/00* (2013.01); *F01D 5/288* (2013.01); *F05C 2253/12* (2013.01); *F05D 2300/506* (2013.01); *Y02T 50/672* (2013.01)

(58) Field of Classification Search
USPC .......................................... 428/697, 698, 699
See application file for complete search history.

(56) References Cited

U.S. PATENT DOCUMENTS

| 4,904,542 A | 2/1990 | Mroczkowski |
| RE34,173 E | 2/1993 | Kerber |

(Continued)

FOREIGN PATENT DOCUMENTS

| CA | 2 327 031 | 5/2001 |
| EP | 1 800 736 A2 | 6/2007 |

(Continued)

OTHER PUBLICATIONS

Yamamoto et al "Structural and mechanical property of Si incorporated (Ti,Cr,Al)N coatings deposited by arc p[lating process" Surface & Technolgy 200 (2005) p. 1383-1390.*

(Continued)

*Primary Examiner* — Archene Turner
(74) *Attorney, Agent, or Firm* — Oblon, McClelland, Maier & Neustadt, L.L.P.

(57) ABSTRACT

A member covered with a hard coating according to the present invention has a hard coating which has excellent erosion resistance, a hardness (H) of 20 GPa or more as measured using a nano indenter and a ratio of the hardness (H) to a Young's modulus (E) (i.e., H/E) of 0.06 or more, and comprises Ti and/or Cr, Al and N, wherein the total amount of Ti and Cr relative to the total amount of elements other than non-metal elements in the coating is 0.1 to 0.6 inclusive in terms of atomic ratio and the amount of Al relative to the total amount of the elements other than the non-metal elements in the coating is 0.4 to 0.7 inclusive in terms of atomic ratio.

6 Claims, 2 Drawing Sheets

(56) References Cited

U.S. PATENT DOCUMENTS

| | | | |
|---|---|---|---|
| 6,025,021 A | 2/2000 | Sue | |
| 6,617,057 B2 | 9/2003 | Gorokhovsky et al. | |
| 6,767,657 B1 | 7/2004 | Nagasaka et al. | |
| 6,824,601 B2 * | 11/2004 | Yamamoto et al. | 428/699 |
| 7,838,132 B2 * | 11/2010 | Ahlgren et al. | 428/697 |
| 8,025,956 B2 * | 9/2011 | Yamamoto et al. | 428/699 |
| 2002/0168552 A1 | 11/2002 | Yamamoto et al. | |
| 2004/0157090 A1 | 8/2004 | Yamamoto et al. | |
| 2006/0018760 A1 | 1/2006 | Bruce et al. | |
| 2007/0087185 A1 * | 4/2007 | Wei et al. | 428/312.8 |
| 2008/0003418 A1 | 1/2008 | Yamamoto et al. | |
| 2008/0102296 A1 | 5/2008 | Ghasripoor et al. | |
| 2008/0171183 A1 | 7/2008 | Yamamoto | |
| 2010/0034660 A1 | 2/2010 | Kawano et al. | |
| 2010/0140529 A1 * | 6/2010 | Ghasripoor et al. | 428/697 |

FOREIGN PATENT DOCUMENTS

| | | | |
|---|---|---|---|
| EP | 1 844 918 A1 | | 10/2007 |
| JP | 2 175859 | | 7/1990 |
| JP | 11 61380 | | 3/1999 |
| JP | 2000-001768 | * | 1/2000 |
| JP | 2000 129420 | | 5/2000 |
| JP | 2001 277251 | | 10/2001 |
| JP | 3391981 | | 1/2003 |
| JP | 2003 71610 | | 3/2003 |
| JP | 2003 71611 | | 3/2003 |
| JP | 2004 256914 | | 9/2004 |
| JP | 2008 7835 | | 1/2008 |
| JP | 2008 163449 | | 7/2008 |
| JP | 2008 174782 | | 7/2008 |
| JP | 2009 293111 | | 12/2009 |
| JP | 2010 59534 | | 3/2010 |
| JP | 2010 70848 | | 4/2010 |
| JP | 2012 1744 | | 1/2012 |

OTHER PUBLICATIONS

Q. Yang, et al., "Erosion resistance performance of magnetron sputtering deposited TiAlN coatings", Surface & Coatings Technology, 188-189, 2004, pp. 168-173.

Written Opinion of the International Searching Authority Issued Aug. 7, 2012 in PCT/JP12/065394 Filed Jun. 15, 2012.

International Search Report Issued Aug. 7, 2012 in PCT/JP12/065394 Filed Jun. 15, 2012.

Tanifuji, S., et al., "Shingata AIP Johatsugen no Hoden Tokusei to Keisei shita Chikkabutsu Himaku no Tokusei", Abstracts of Autumn Meeting of Japan Society of Powder and Powder Metallurgy, vol. 2010, p. 17, (2010).

Yamamoto, K., et al., "AIP-ho de Keisei shita TiCrAlN-kei Tasomaku no Kozo to Sessaku Tokusei", Abstracts of Autumn Meeting of Japan Society of Powder and Powder Metallurgy, vol. 2010, p. 18, (2010).

Yamamoto, T., et al., "Effects of thermal annealing on phase transformation and microhardness of $(Ti_xCr_yAl_z)N$ films", Surface & Coatings Technology, vol. 200, pp. 321-325, (2005).

L.R. Zhao, et al., "Erosion behavior of metal nitride coatings fabricated by physical vapor deposition" Aerospace Materials & Manufacturing: Emerging Materials, Processes and Repair Techniques 45th Annual Conference of Metallurgists of CIM, 2010, pp. 11-20.

Supplementary European Search Report issued Mar. 11, 2015 in Patent Application No. 12799841.7.

Supplementary European Search Report issued Aug. 6, 2015 in Patent Application No. 12799841.7.

* cited by examiner

MEMBER COVERED WITH HARD COATING

TECHNICAL FIELD

The present invention relates to a member covered with a hard coating, wherein the surface is covered with the hard coating.

BACKGROUND ART

Parts, for example, steam turbine blades, jet engine compressor blades, compressor screws for gas, liquid compression, turbo compressor impellers, and fuel injection valves, undergo erosion by solid particles, liquids (fluids), and the like. Also, parts (apparatuses) for agitating, transporting, or pulverizing powders (i.e., solid particles) or fluids containing powders undergo erosion because of an occurrence of abrasive wear due to solid particles, liquids (fluids), and the like. In general, hard coatings are formed on part surfaces to protect these parts from erosion. For example, the following literatures have been disclosed with respect to such hard coatings.

PTL 1 discloses a multilayer film in which mild, ductile composition layers and hard fragile composition layers are alternately stacked as a coating having excellent erosion resistance (resistance to erosion). Then, a multilayer film of TiN/Ti is mentioned as an example thereof. Meanwhile, PTL 2 discloses a multilayer film in which $Ti_{1-x}N_x$ films having different amounts of nitrogen are stacked. Furthermore, PTL 3 discloses a nitride containing titanium nitride as a primary component and at least one element of Al, Cr, Zr, and Hf. Specifically, it is disclosed that the chemical composition is Ti(100−x)Mex nitride (where Me: at least one element selected from Al, Cr, Zr, and Hf, x satisfies 2%≤x≤30% (atomic percentage (%))).

In addition, PTL 4 discloses a multilayer abrasion-resistant coating on a support surface, wherein the coating is composed of a plurality of layers of metal material and ceramic material and is for the purpose of protection from erosion by particles, erosion by water, and corrosion by these particles and water. Also, a coating is disclosed, in which the above-described metal material is made from at least one element selected from the group consisting of titanium, zirconium, hafnium, and tantalum and the above-described ceramic material is a nitride of the above-described selected metal material. In addition, PTLs 5 to 7 disclose multilayer films in which metal layers selected from Ti, Cr, V, Al, Mo, Nb, W, Zr, and Hf and ceramic layers of nitrides and the like are stacked.

CITATION LIST

Patent Literature

PTL 1: Japanese Unexamined Patent Application Publication No. 2008-163449

PTL 2: Japanese Patent No. 3391981

PTL 3: Japanese Unexamined Patent Application Publication No. 2000-129420

PTL 4: Japanese Unexamined Patent Application Publication No. 02-175859

PTL 5: Canadian Patent No. 2327031

PTL 6: U.S. Patent Application Publication No. 2002/0102400

PTL 7: U.S. Pat. No. 6,617,057

SUMMARY OF INVENTION

Technical Problem

However, such hard coatings have problems as described below.

As for PTLs 1 and 2, it is not said that each of TiN and Ti has sufficiently high erosion resistance, and even when the multilayer film is formed, the erosion resistance is not improved sufficiently.

As for PTL 3, a favorable composition of Me corresponding to Al is specified to be up to 30 atomic percent. However, if the amount of Al is 30 atomic percent or less, the erosion resistance is not improved. Meanwhile, comparative examples in which Al is up to 52 atomic percent are disclosed, and the coating is formed by a dynamic mixing method on the basis of combination of evaporation and ion implantation. However, in the case where the coating is formed by the dynamic mixing method, the erosion resistance is not improved when the amount of Al is more than 30 atomic percent. As for PTLs 4 to 7, in the case of a multilayer of the metal layers and the ceramic layers, there is a problem in that the erosion rate increases as a whole because the erosion rate of the metal layer is large. In this regard, the composition of the ceramic layer is not specified and, therefore, the erosion resistance is not enhanced depending on the composition.

The present invention has been made in consideration of the above-described problems, and it is an issue to provide a member covered with a hard coating having excellent erosion resistance.

Solution to Problem

In the present invention and the like, studies on the erosion resistance of a hard coating were performed. As a result, it was found that the erosion resistance of the coating was not only determined on the basis of the hardness (H) of the coating, but also was determined on the basis of the value produced by dividing the hardness (H) by the Young's modulus (E), i.e., the ratio (H/E) of the hardness (H) to the Young's modulus (E), where the hardness (H) was more than or equal to a certain value, (hereafter appropriately referred to as the ratio (H/E)).

That is, a member covered with a hard coating, according to the present invention (hereafter appropriately referred to as a member), is characterized by including a substrate used for any one selected from the group consisting of a steam turbine blade, a jet engine compressor blade, a compressor screw for gas or liquid compression, a turbo compressor impeller, and a fuel injection valve and a hard coating covering the above-described substrate, wherein with respect to the hardness (H) and the Young's modulus (E), which are measured using a nano indenter, of the above-described hard coating, the above-described hardness (H) is 20 GPa or more and the ratio (H/E) of the above-described hardness (H) to the above-described Young's modulus (E) is 0.06 or more, the above-described hard coating comprises Ti and/or Cr, Al, and N, the total amount of Ti and Cr relative to the total amount of elements other than non-metal elements in the coating is 0.1 to 0.6 inclusive in terms of atomic ratio, and the amount of Al relative to the total amount of the elements other than the non-metal elements in the coating is 0.4 to 0.7 inclusive in terms of atomic ratio.

Meanwhile, a member covered with a hard coating, according to the present invention, is characterized by including a substrate used for an apparatus to agitate, transport, or pulverize a powder or a fluid containing a powder and a hard coating covering a sliding surface of the above-described substrate to come into contact with the above-described powder, wherein with respect to the hardness (H) and the Young's modulus (E), which are measured using a nano indenter, of the above-described hard coating, the above-described hardness (H) is 20 GPa or more and the ratio (H/E) of the above-described hardness (H) to the above-described Young's modulus (E) is 0.06 or more, the above-described hard coating comprises Ti and/or Cr, Al, and N, the total amount of Ti and Cr relative to the total amount of elements other than non-metal elements in the coating is 0.1 to 0.6 inclusive in terms of atomic ratio, and the amount of Al relative to the total amount of the elements other than the non-metal elements in the coating is 0.4 to 0.7 inclusive in terms of atomic ratio.

According to these configurations, the erosion resistance of the member is improved by specifying the hardness (H) of the coating to be 20 GPa or more and the ratio (H/E) of the hardness (H) to the Young's modulus (E) to be 0.06 or more. Also, the hardness (H) of the coating of the member is improved by specifying the total amount of Ti and Cr in the coating to be 0.1 or more on an atomic ratio basis. Meanwhile, the ratio (WE) in the coating of the member becomes 0.06 or more by specifying the total amount of Ti and Cr in the coating to be 0.6 or less on an atomic ratio basis. Furthermore, the erosion resistance of the member is improved by specifying the amount of Al in the coating to be 0.4 or more on an atomic ratio basis. In addition, in the case where the member contains N, a nitride serving as a skeleton of the coating is formed through bonding with a metal element or a metalloid element.

Meanwhile, in the member covered with a hard coating, according to the present invention, preferably, the above-described hard coating has a composition of $(Ti_a Cr_b Al_c Si_d B_e Y_f)(C_x N_y)$, where the above-described a, b, c, d, e, f, x, and y represent atomic ratios and $0 \leq a \leq 0.6$ $0 \leq b \leq 0.6$ $0.4 \leq c \leq 0.7$ $0 \leq d \leq 0.15$ $0 \leq e \leq 0.1$ $0 \leq f \leq 0.05$ $0.1 \leq a+b \leq 0.6$ $a+b+c+d+e+f=1$ $0 \leq x \leq 0.5$ $0.5 \leq y \leq 1$ $x+y=1$ are satisfied.

According to such a configuration, a predetermined amount of Si is contained, as necessary, in the coating of the member and, thereby, the coating is made fine, the hardness (H) increases, and the Young's modulus (E) decreases. Also, predetermined amounts of B and Y are contained, as necessary, in the coating of the member and, thereby, the hardness (H) does not decrease and the Young's modulus (E) decreases. Consequently, the ratio (HIE) of the member is increased by containing predetermined amounts of Si, B, and Y in the coating. Also, the coating of the member is made into the form of a carbonitride by containing, as necessary, a predetermined amount of C in the coating.

Meanwhile, in the member covered with a hard coating, according to the present invention, preferably, the above-described hard coating has a composition of $(Ti_a Cr_b Al_c Si_d)(C_x N_y)$, where the above-described a, b, c, d, x, and y represent atomic ratios and $0 \leq a \leq 0.5$ $0 \leq b \leq 0.5$ $0.5 \leq c \leq 0.65$ $0 \leq d \leq 0.05$ $0.1 \leq a+b \leq 0.6$ $a+b+c+d=1$ $0 \leq x \leq 0.2$ $0.8 \leq y \leq 1$ $x+y=1$ are satisfied.

According to such a configuration, the erosion resistance of the member can be improved by further specifying the contents of Ti, Cr, Al, Si, C, and N to be predetermined amounts.

Advantageous Effects of Invention

The member provided with the hard coating, according to the present invention, has excellent erosion resistance. Consequently, the member can be used favorably as members for the parts which may undergo erosion by solid particles or a fluid and the erosion resistance of those parts is improved.

DESCRIPTION OF EMBODIMENTS

Figure 1:
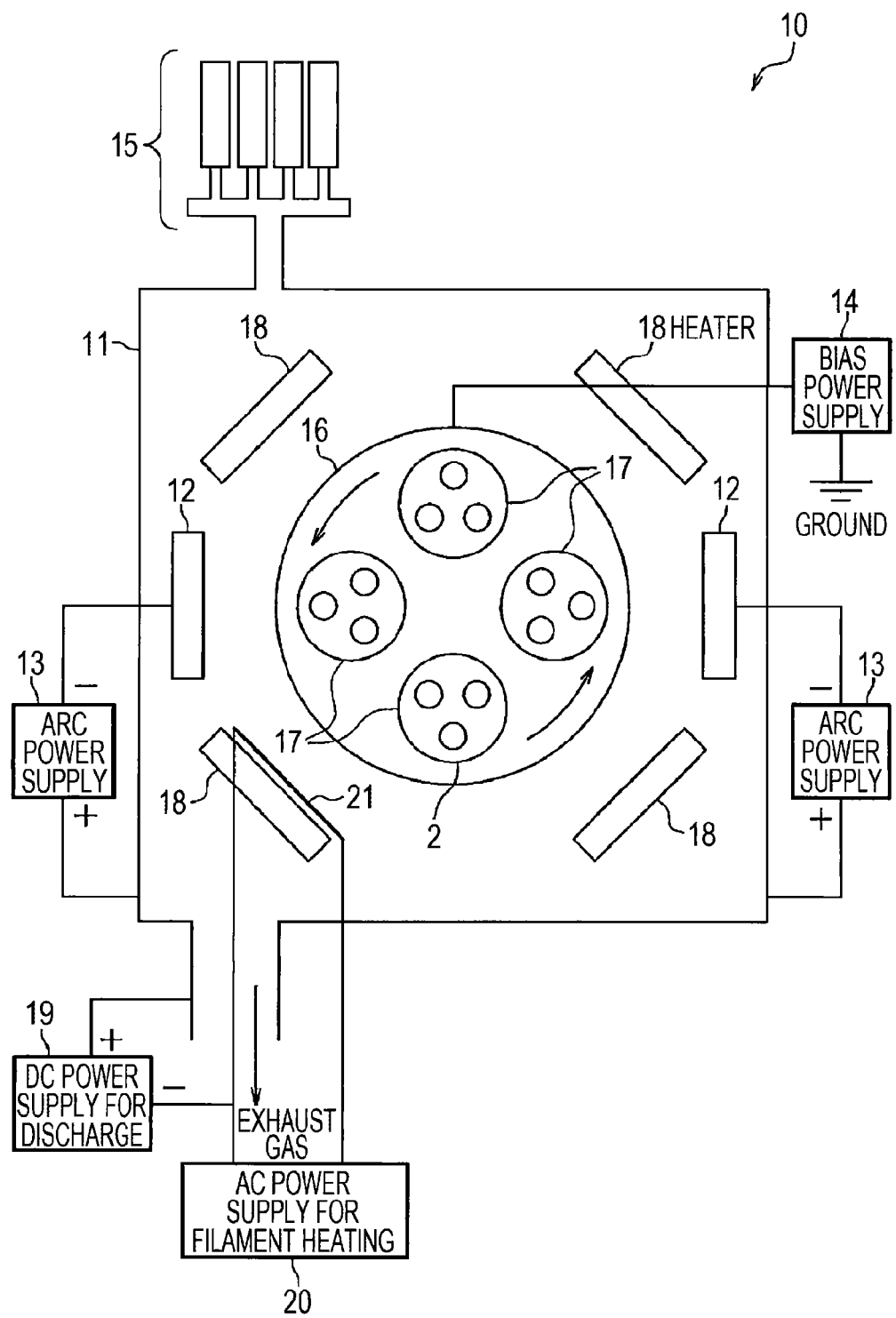
FIG. 1 is a schematic diagram showing an example of a film formation apparatus to form a hard coating of a member covered with a hard coating, according to the present invention.

Next, a member covered with a hard coating, according to the present invention, will be described in detail.

The member covered with a hard coating, according to the present invention, includes a substrate and a hard coating covering the substrate. In this regard, the term "covering the substrate" includes the case where part of the substrate is covered besides the case where the whole substrate is covered. For example, in a second embodiment described later, it is enough that a sliding surface of a substrate to come into contact with a powder is covered. A specific explanation will be provided below.

(Substrate)

The substrate in a first embodiment is used for any one selected from the group consisting of a steam turbine blade, a jet engine compressor blade, a compressor screw for gas or liquid compression, a turbo compressor impeller, and a fuel injection valve. That is, the coating in the member according to the present invention is utilized as a protective coating of an area (part), e.g., a blade used for a compressor of an airplane engine and an impeller or a blade of a compressor or the like, which may undergo erosion by solid particles or a fluid. The member covered with a hard coating, according to the present invention, has excellent erosion resistance and, therefore, is suitable for the uses, e.g., a steam turbine blade, which undergoes such erosion. Examples of materials for them include titanium alloys, aluminum alloys, stainless steel, and Inconel.

Meanwhile, the substrate in the second embodiment is used for an apparatus to agitate, transport, or pulverize a powder or a fluid containing a powder. Examples of apparatuses to agitate, transport, or pulverize a powder or a fluid containing a powder include parts of a pulverizer used in production of a ceramic powder through pulverization, a cylinder of a slurry pump, an agitation impeller, and casings to hold them. These members come into direct contact with a moving powder or a fluid containing a high concentration of powder and undergo abrasive wear by a powder or a fluid moving on the member surface. Therefore, the abrasion resistance can be improved significantly by forming the hard coating specified in the present invention. In the case of use for the above-described purpose, in particular under an environment containing water, it is desirable that at least one layer of intermediate layer be disposed between the hard coating specified in the present invention and the substrate to improve an environment barrier property. For example, CrN is recommended as the intermediate layer, and the film thickness is 1 μm or more, and more preferably 3 μm or more.

As described above, the members covered with a hard coating in both the first and second embodiments may be formed from only the substrate and the hard coating or other layers, e.g., the intermediate layer, may be disposed.

(Hard Coating)

With respect to the hardness (H) and the Young's modulus (E), which are measured using a nano indenter, of the coating, the hardness (H) is specified to be 20 GPa or more and the ratio (H/E) of the hardness (H) to the Young's modulus (E) is specified to be 0.06 or more.

In order to improve the erosion resistance significantly, it is necessary that 20 GPa or more of hardness (H) be satisfied and, in addition, the ratio (H/E) is specified to be 0.06 or more. Therefore, the hardness (H) is specified to be 20 GPa or more, preferably 25 GPa or more, and more preferably, 30 GPa or more. Meanwhile, the ratio (WE) is specified to be 0.06 or more, and preferably 0.07 or more. On the other hand, the hardness (H) is preferably 55 GPa or less, and the ratio (H/E) is preferably 0.13 or less.

The hardness (H) and the ratio (H/E) of the coating are controlled by the components of the coating, the film formation method, and the film formation condition. In this regard, even when the compositions of the coatings are the same, the value of the ratio (H/E) is changed depending on the film formation method and the film formation condition. Therefore, in order to improve the erosion resistance, setting of appropriate film formation method and condition are necessary. Here, as described later, the film is formed by an AIP (Arc Ion Plating) method, a sputtering method, or a HCD (Hollow Cathode Discharge) method. By the way, a bias voltage applied to the substrate during film formation is important in the film formation. According to the studies up to this time, as the bias increases (large negative value), the erosion resistance is enhanced, but the stress increases, so that the coating is peeled easily. Meanwhile, in the case where attachment of a thick film is intended, a reduction in bias is advantageous. Therefore, an appropriate control range of the bias is −20 to −100 V. Other conditions (temperature, pressure) are almost constant.

The hardness (H) and the Young's modulus (E) of the coating are measured using a nano indenter. In an example of a measurement by using the nano indenter, "ENT-1100 produced by ELIONIX INC." is used as an apparatus, and a Berkovich type triangular pyramid indenter is used as the indenter. Initially, a loading curve is measured at five points each of five loads, which are loads of 2, 5, 7, 10, and 20 mN. Subsequently, the data were corrected on the basis of the compliance of apparatus and a method for calibrating an indenter tip shape (J. Mater. Res. Vol. 16 No. 11 (2001) 3084) proposed by SAWA et al. and the hardness (H) and the Young's modulus (E) of the coating are determined. At that time, 1,000 GPa can be used as the Young's modulus (E) of a diamond indenter and 0.22 can be used as the Poisson ratio.

Also, the coating is specified to comprise Ti and/or Cr, Al and N, wherein the total amount of Ti and Cr relative to the total amount of elements other than non-metal elements in the coating is specified to be 0.1 to 0.6 inclusive in terms of atomic ratio and the amount of Al relative to the total amount of the elements other than the non-metal elements in the coating is specified to be 0.4 to 0.7 inclusive in terms of atomic ratio. As described above, the hardness (H) and the ratio (H/E) of the coating fall within the scope of the present invention by employing appropriate film formation method and film formation condition and, in addition, specifying these elements. In this regard, metal elements may include elements other than Ti, Cr, and Al and may further include metalloid elements. Therefore, the term "the total amount of the elements other than non-metal elements" specifically refers to "the total amount of metal elements in the coating" or "the total amount of metal elements and metalloid elements in the coating".

[Total Amount of Ti and Cr: 0.1 to 0.6 Inclusive on an Atomic Ratio Basis]

In order to improve the hardness (H) of the coating, it is necessary that the total amount of addition of Ti and Cr relative to elements other than non-metal elements in the coating be 0.1 or more on an atomic ratio basis. On the other hand, if 0.6 is exceeded, the ratio (H/E) decreases. Therefore, the upper limit is specified to be 0.6, and preferably 0.5 or less. Addition of Ti and Cr alone or in combination is performed within the range of 0.6 or less.

[Amount of Al: 0.4 to 0.7 Inclusive on an Atomic Ratio Basis]

In order to improve the erosion resistance, it is necessary that the total amount of addition of Al relative to elements other than non-metal elements in the coating be 0.4 or more on an atomic ratio basis. With respect to the composition of the coating, in the case where the hardness (H) and the ratio (H/E) are satisfied, the erosion resistance is enhanced to some extent. However, with respect to Al containing nitride or carbonitride in the coating, particularly the ratio (H/E) increases and, as a result, the erosion resistance is more enhanced. Therefore, in the present invention, addition of Al to the coating is indispensable. In this regard, in order to obtain the effect thereof, addition of 0.4 or more on an atomic ratio basis is necessary. Meanwhile, if the atomic ratio is less than 0.4, the hardness (H) and the ratio (H/E) may decrease depending on the composition of the coating. Therefore, the Al content is specified to be 0.4 or more on an atomic ratio basis, preferably 0.45 or more, and more preferably 0.5 or more. On the other hand, if Al is added excessively, the hardness (H) decreases and the ratio (H/E) decreases. Therefore, the upper limit is specified to be 0.7, and more preferably 0.65 or less.

In addition, it is necessary that N be added indispensably. It is enough that the amount of addition is more than 0. Preferably, the proportion in the total elements in the coating is 0.5 or more, and more preferably 0.8 or more, that is, close to the ratio of metal to nitrogen of 1 which is the stoichiometric composition of a metal (or containing metalloid) nitride.

The composition of the coating can be measured by EDX analysis using EDX (Energy Dispersive X-ray Spectrometer), as an example.

Consequently, the hard coating can be as described below.

The hard coating has a composition of $(Ti_aCr_bAl_c)N_y$, where the above-described a, b, c, and y represent atomic ratios and $$0 \leq a \leq 0.6$$

$$0 \leq b \leq 0.6$$

$$0.4 \leq c \leq 0.7$$

$$0.1 \leq a+b \leq 0.6$$

$$a+b+c=1$$

$$y=1$$

are satisfied.

The coating may contain at least one type selected from Zr, Hf, V, Nb, Ta, Mo, W, Re, Fe, Ca, S, Cu, Ni, Si, B, and Y as a metal element or a metalloid element besides Ti, Cr, and Al, which are metal elements. Also, nitrogen is indispensable as a non-metal element, and C may be contained, as necessary. The nitrogen content relative to the total amount of nitrogen and carbon is preferably 0.5 or more on an atomic ratio basis.

Therefore, the coating can have a composition of $(Ti_aCr_bAl_cM_d)(C_xN_y)$, where M described above represents at least one type of element selected from Zr, Hf, V, Nb, Ta, Mo, W, Re, Fe, Ca, S, Cu, Ni, Si, B, and Y, the above-described a, b, c, d, x, and y represent atomic ratios, and $$0 \leq a \leq 0.6$$

$$0 \leq b \leq 0.6$$

$$0.4 \leq c \leq 0.7$$

$$0 \leq d \leq 0.5$$

$$0.1 \leq a+b \leq 0.6$$

$$a+b+c+d=1$$

$$0 \leq x \leq 0.5$$

$$0.5 \leq y \leq 1$$

$$x+y=1$$

are satisfied.

Here, Zr, Hf, V, Nb, Ta, Mo, W, Re, Fe, Ca, S, Cu, Ni, Si, B, and Y serving as M may be added alone or at least two types may be added in combination. The total amount of elements serving as M is specified to be preferably 0.5 or less on an atomic ratio basis. In the case of 0.5 or less, the erosion resistance is improved easily. Meanwhile, as described later, in the case where Si, B, and Y are used as M, preferably, the atomic ratio of Si is 0.15 or less, the atomic ratio of B is 0.1 or less, and the atomic ratio of Y is 0.05 or less. In this regard, each element will be explained later.

Next, among the above-described compositions, two compositions will be explained below as examples of preferable compositions.

<Preferable Composition (1) of Coating>

The coating has a composition of $(Ti_aCr_bAl_cSi_dB_eY_f)(C_xN_y)$, where the above-described a, b, c, d, e, f, x, and y represent atomic ratios and $$0 \leq a \leq 0.6$$

$$0 \leq b \leq 0.6$$

$$0.4 \leq c \leq 0.7$$

$$0 \leq d \leq 0.15$$

$$0 \leq e \leq 0.1$$

$$0 \leq f \leq 0.05$$

$$0.1 \leq a+b \leq 0.6$$

$$a+b+c+d+e+f=1$$

$$0 \leq x \leq 0.5$$

$$0.5 \leq y \leq 1$$

$$x+y=1$$

are satisfied.

Each element will be described below. In this regard, as described above, at least one type of element selected from Zr, Hf, V, Nb, Ta, Mo, W, Re, Fe, Ca, S, Cu, Ni, Si, B, and Y may be added as the predetermined element M. However, it is preferable that Si, B, and Y be selected among them for the reason described later.

[Ti: $a(0 \leq a \leq 0.6, 0.1 \leq a+b \leq 0.6, a+b+c+d+e+f=1)$]

[Cr: $b(0 \leq a \leq 0.6, 0.1 \leq a+b \leq 0.6, a+b+c+d+e+f=1)$]

The letter (a) represents an atomic ratio of Ti, and the letter (b) represents an atomic ratio of Cr. As described above, in order to improve the hardness (H) of the coating, addition of total amount of Ti and Cr of 0.1 or more is necessary relative to the coating. On the other hand, if the total amount of Ti and Cr is more than 0.6, the ratio (H/E) decreases and, therefore, the upper limit is specified to be 0.6. Consequently, each of the upper limits of Ti and Cr is specified to be 0.6. Preferably, the total amount is 0.5 or less and each of them is 0.5 or less.

[Al: $c(0.4 \leq c \leq 0.7, a+b+c+d+e+f=1)$]

The letter (c) represents an atomic ratio of Al. As described above, in order to improve the erosion resistance, addition of total amount of Al of 0.4 or more is necessary relative to the coating, 0.45 or more is preferable, and 0.5 or more is more preferable. On the other hand, if Al is added excessively, the hardness (H) decreases, and the ratio (H/E) decreases. Therefore, the upper limit is specified to be 0.7, and more preferably 0.65 or less.

[Si: $d(0 \leq d \leq 0.15, a+b+c+d+e+f=1)$]

The letter (d) represents an atomic ratio of Si. In the case where Si is added, the coating is made fine, the hardness (H) increases, and the Young's modulus (E) decreases. As a result thereof, the ratio (H/E) can take on a large value. Silicon is an optional component and is not necessarily added. However, an effect thereof is observed when d is 0.02 or more. Therefore, addition of 0.02 or more is preferable. On the other hand, hardening of the coating is facilitated by specifying the amount of addition to be 0.15 or less. Therefore, the upper limit is specified to be preferably 0.15, more preferably 0.1 or less, and further preferably 0.05 or less.

[B: $e(0 \leq e \leq 0.1, a+b+c+d+e+f=1)$]

[Y: $f(0 \leq f \leq 0.05, a+b+c+d+e+f=1)$]

The letter (e) represents an atomic ratio of B and the letter (f) represents an atomic ratio of Y. Boron and yttrium are optional components and are not necessarily added. However, the Young's modulus (E) can be decreased without decreasing the value of the hardness (H) by addition of 0.1 or less of B or 0.05 or less of Y. Therefore, the upper limits of B and Y are specified to be 0.1 and 0.05, respectively.

[C: $x(0 \leq x \leq 0.5, x+y=1)$]

The letter (x) represents an atomic ratio of C. The compound according to the present invention does not only take on the form of a nitride, but can also become a carbonitride by introducing a gas containing C during film formation. As described later, it is preferable that 0.5 or more of N be added relative to the total amount of N and C. Therefore, the upper limit of C is specified to be preferably 0.5, and more preferably 0.2 or less.

[N: $y(0.5 \leq y \leq 1, x+y=1)$]

The letter (y) represents an atomic ratio of N. Nitrogen is bonded to a metal element or a metalloid element to play a role in forming a nitride which serves as a skeleton of the coating according to the present invention. Therefore, addition of more than 0 is necessary. Meanwhile, if the amount of addition is 0.5 or more relative to the total amount of N and C, a nitride is formed more easily. Therefore, addition of 0.5 or more is preferable, and 0.8 or more is more preferable.

<Preferable Composition (2) of Coating>

The coating has a composition of $(Ti_aCr_bAl_cSi_d)(C_xN_y)$, where the above-described a, b, c, d, x, and y represent atomic ratios and $0 \leq a \leq 0.5$ $0 \leq b \leq 0.5$ $0.5 \leq c \leq 0.65$ $0 \leq d \leq 0.05$ $0.1 \leq a+b \leq 0.6$ $a+b+c+d=1$ $0 \leq x \leq 0.2$ $0.8 \leq y \leq 1$ $x+y=1$ are satisfied.

This coating has the above-described preferable composition (1), where each of the Ti and Cr contents is specified to be 0.5 or less, the Al content is specified to be 0.5 to 0.65 inclusive, the Si content is specified to be 0.05 or less, the carbon content is specified to be 0.2 or less, the N content is specified to be 0.8 or more, and B and Y are not added. That is, Ti, Cr, Al, Si, C, and N elements are specified to be within a particularly preferable range. In this regard, the ratio (H/E) can be sufficiently increased here, so that B and Y are not added. However, predetermined amounts of B and Y may be added as with the preferable composition (1). The others are the same as those of the above-described preferable composition (1) and, therefore, explanations are not provided here.

As described above, Ti, Cr, Al, and N are indispensable components and Si, B, Y, and C are optional components, so that examples of combinations of the coating composition include (TiCrAl)N, (TiCrAlSi)N, (TiCrAlB)N, (TiCrAlY)N, (TiCrAlBY)N, (TiCrAlSiB)N, (TiCrAlSiY)N, (TiCrAlSiBY)N, (TiCrAl)(CN), (TiCrAlSi)(CN), (TiCrAlB)(CN), (TiCrAlY)(CN), (TiCrAlBY)(CN), (TiCrAlSiB)(CN), (TiCrAlSiY)(CN), and (TiCrAlSiBY)(CN). More specifically, for example, "(Ti0.4Al0.6)N", "(Ti0.2Cr0.2Al0.55Si0.05)N", and the like are mentioned.

In the member according to the present invention, these coatings may be formed on a substrate as a single layer, or be formed as a plurality of layers. Specifically, coatings satisfying the specifications according to the present invention and having mutually different compositions may be stacked. Alternatively, coatings satisfying the specifications according to the present invention may be included partly in coatings which are out of the specifications according to the present invention. In this regard, in order to obtain sufficient erosion resistance, the total thickness of the coatings satisfying the specifications according to the present invention is preferably more than 5 μm, and more preferably 10 μm or more.

In the above-described member, it is necessary that the coating be formed by an arc ion plating method, a sputtering method, or a HCD method. In this regard, a vacuum evaporation method cannot form a dense coating because the degree of ionization of particles for film formation or a gas used in film formation is low as compared with that in the above-described individual methods. Therefore, the vacuum evaporation method is unsuitable.

Next, film formation by using an AIP method will be described as an example of film formation methods. In order to perform the AIP method, for example, the following apparatus can be used.

As shown in FIG. 1, a film formation apparatus 10 includes a chamber 11 having an exhaust opening to evacuate and a gas feed opening 15 to feed a film formation gas and a noble gas, arc power supplies 13 connected to arc evaporation sources 12, support tables 17 on a substrate stage 16 to support subjects to be treated (substrates 2), and a bias power supply 14 to apply a negative bias voltage to the subjects to be treated between the support tables 17 and the above-described chamber 11 through the support tables 17. In addition, heaters 18, a DC power supply for discharge 19, an AC power supply for filament heating 20, a filament 21, and the like. In film formation to obtain the member according to the present invention, as for gases fed into the chamber 11 from the gas feed opening 15, film formation gases, e.g., nitrogen ($N_2$) and methane ($CH_4$), and a mixed gas of these gases and a noble gas, e.g., argon, are used in accordance with the film formation components (coating composition).

Then, in an example of the film formation methods, initially, the substrate 2 is introduced into the film formation apparatus 10, evacuation to $1 \times 10^{-3}$ Pa or less is performed and, thereafter, the substrate 2 is heated to 400° C. Subsequently, sputter cleaning by using Ar ions is performed, nitrogen is introduced into the chamber 11 up to 4 Pa, and nitride are formed on the substrate 2 by performing arc discharge by using various targets at a current value of 150 A. Meanwhile, in the case where C is contained in the coating, a methane gas is also introduced at within the range of 0.1 to 0.5 Pa. In this regard, the bias voltage during film formation is specified to be within the range of −20 to −100 V relative to a ground potential.

EXAMPLES

Examples and comparative examples according to the present invention will be described below. In this regard, the present invention is not limited to these examples and can be executed while being modified within the range in conformity with the gist of the present invention. Any of them is included in the technical scope of the present invention.

In order to evaluate the erosion resistance of the coating, about 10 μm of various types of coatings shown in Table 1 were formed on SUS630 substrates (mirror polishing, H900 heat treatment) by an arc ion plating method. In film formation, an AIP apparatus (AIP-SS002, Kobe Steel, Ltd.) having an arc evaporation source as shown in FIG. 1 was used. The following are specific description.

Initially, a substrate was introduced into the film formation apparatus, evacuation to $1\times10^{-3}$ Pa or less was performed and, thereafter, the substrate was heated to 400° C. Subsequently, sputter cleaning by using Ar ions was performed, nitrogen was introduced into the chamber up to 4 Pa, and nitrides shown in Table 1 were formed on the substrates by performing arc discharge by using various targets at a current value of 150 A. Meanwhile, in the case where C was contained in the coating, a methane gas was also introduced at within the range of 0.1 to 0.5 Pa. In this regard, the bias voltage during film formation was specified to be within the range of −20 to −100 V relative to a ground potential.

After the film formation was finished, analysis of the metal component composition in the coating and measurements of the hardness and the Young's modulus of the coating were performed and, in addition, the erosion resistance of the coating was evaluated. They are described below and the results are shown in Table 1. In this regard, in the table, numerical values and the like which do not satisfy the configuration of the present invention and those which do not satisfy acceptance criteria are underlined.

<Coating Composition>

As for the composition after the film formation, the component composition of metal elements in a coating of a cemented carbide alloy substrate was measured on the basis of EDX analysis.

<Hardness and Young's Modulus>

The hardness (H) and the Young's modulus (E) of the coating were measured using a nano indenter. As for the measurement with the nano indenter, "ENT-1100 produced by ELIONIX INC." was used as an apparatus, and a Berkovich type triangular pyramid indenter was used as the indenter. Initially, a loading curve was measured at five points each of five loads, which were loads of 2, 5, 7, 10, and 20 mN. Subsequently, the data were corrected on the basis of the compliance of apparatus and a method for calibrating an indenter tip shape (J. Mater. Res. Vol. 16 No. 11 (2001) 3084) proposed by SAWA et al., and the hardness (H) and the Young's modulus (E) of the coating were determined. At that time, 1,000 GPa was used as the Young's modulus (E) of a diamond indenter and 0.22 was used as the Poisson ratio.

<Erosion Resistance>

The erosion resistance was evaluated on the basis of an erosion test. The erosion test was performed by the method described in Japanese Patent No. 3356415 and "Evaluation of Wear Properties of DLC Films by a Micro Slurry-Jet Erosion (MSE) Test" (Transactions of the Japan Society of Mechanical Engineers. C Vol. 75 No. 749 (2009-1) P171-177). That is, a method in which a jet water stream containing alumina particles was ejected to a test piece for a certain time, the erosion depth thereof was measured, and the erosion resistance was evaluated was used.

Alumina particles (#320, average particle diameter 48 μm) were used, and the concentration of the particles was specified to be 1% relative to water on a mass ratio basis. The jet water stream was ejected toward the test piece from the position at a distance of about 10 mm in the direction of the normal to the test piece (90° from a horizontal plane), the depth of a crater generated in the test piece by erosion was measured after the test with a surface roughness tester, and the erosion rate (μm/min) was calculated from the relationship between the test time (adjusted within the range of about 200 to 5,000 seconds on the basis of the erosion rate of the sample, where samples exhibiting high erosion rates were tested for 2,000 to 5,000 seconds to reduce the measurement error of crater depth and increase the reliability of data) and the erosion depth. Then, the case where the erosion rate was 0.1 μm/min or less was evaluated as acceptable, and the case where the erosion rate was more than 0.1 μm/min was evaluated as unacceptable.

Figure 2:
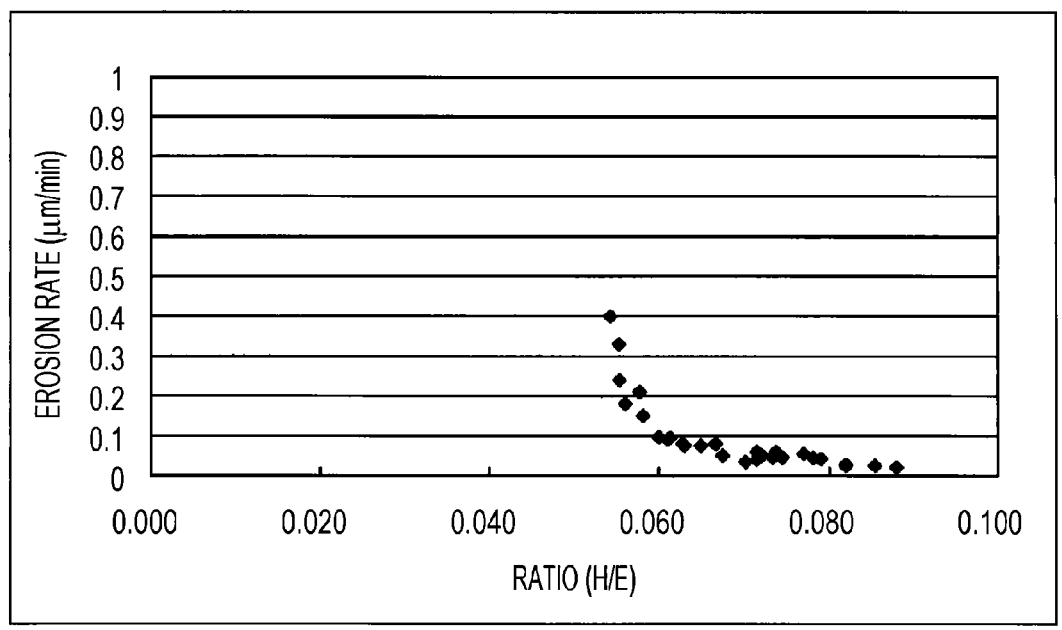
FIG. 2 is a graph showing the relationship between the ratio (H/E) of the hardness (H) to the Young's modulus (E) and the erosion rate in examples.

Table 1 shows the evaluation results of the individual samples tested. In addition, FIG. 2 shows the relationship between the ratio (H/E) and the erosion rate.

TABLE 1

| No. | Coating composition | Hardness (H) (GPa) | Young's modulus (E) (GPa) | Ratio (H/E) | Erosion resistance Erosion rate (μm/min) |
|---|---|---|---|---|---|
| 1 | Ti | 4.0 | 200 | 0.020 | 4.8 |
| 2 | TiN | 22.0 | 479 | 0.046 | 1.8 |
| 3 | Ti0.7N0.3 | 18.0 | 400 | 0.045 | 2.1 |
| 4 | CrN | 15.0 | 359 | 0.042 | 2.6 |
| 5 | (Ti0.5Cr0.5)N | 21.0 | 450 | 0.047 | 1.8 |
| 6 | (Ti0.75Al0.25)N | 23.6 | 427 | 0.055 | 0.33 |
| 7 | (Ti0.7Al0.3)N | 26.6 | 480 | 0.055 | 0.24 |
| 8 | (Ti0.5Al0.5)N | 26.1 | 428 | 0.061 | 0.09 |
| 9 | (Ti0.4Al0.6)N | 29.7 | 423 | 0.070 | 0.035 |
| 10 | (Ti0.3Al0.7)N | 27.0 | 440 | 0.061 | 0.095 |
| 11 | (Ti0.25Al0.75)N | 25.0 | 430 | 0.058 | 0.15 |
| 12 | (Cr0.5Al0.5)N | 25.2 | 400 | 0.063 | 0.075 |
| 13 | (Ti0.2Cr0.5Al0.3)N | 25.0 | 430 | 0.058 | 0.15 |
| 14 | (Ti0.2Cr0.4Al0.4)N | 27.0 | 430 | 0.063 | 0.08 |
| 15 | (Ti0.2Cr0.35Al0.45)N | 29.0 | 430 | 0.067 | 0.05 |
| 16 | (Ti0.2Cr0.3Al0.5)N | 30.0 | 420 | 0.071 | 0.04 |
| 17 | (Ti0.2Cr0.1Al0.7)N | 32.0 | 430 | 0.074 | 0.045 |
| 18 | (Ti0.1Cr0.1Al0.8)N | 26.0 | 450 | 0.058 | 0.21 |
| 19 | (Ti0.2Cr0.2Al0.58Si0.02)N | 33.0 | 450 | 0.073 | 0.045 |
| 20 | (Ti0.2Cr0.2Al0.55Si0.05)N | 35.6 | 405 | 0.088 | 0.021 |
| 21 | (Ti0.22Cr0.21Al0.52Si0.05)N | 35.0 | 410 | 0.085 | 0.025 |
| 22 | (Ti0.19Cr0.18Al0.58Si0.05)N | 34.0 | 415 | 0.082 | 0.027 |
| 23 | (Ti0.2Cr0.2Al0.5Si0.1)N | 30.0 | 390 | 0.077 | 0.055 |

TABLE 1-continued

| No. | Coating composition | Hardness (H) (GPa) | Young's modulus (E) (GPa) | Ratio (H/E) | Erosion resistance Erosion rate (μm/min) |
|---|---|---|---|---|---|
| 24 | (Ti0.15Cr0.2Al0.5Si0.15)N | 28.0 | 380 | 0.074 | 0.06 |
| 25 | (Ti0.15Cr0.15Al0.5Si0.2)N | 26.0 | 400 | 0.065 | 0.075 |
| 26 | (Ti0.2Cr0.2Al0.5Si0.05B0.05)N | 32.0 | 410 | 0.078 | 0.044 |
| 27 | (Ti0.2Cr0.15Al0.5Si0.05B0.1)N | 30.0 | 380 | 0.079 | 0.042 |
| 28 | (Ti0.2Cr0.2Al0.53Si0.05Y0.02)N | 34.0 | 415 | 0.082 | 0.025 |
| 29 | (Ti0.2Cr0.1Al0.7)C0.2N0.8 | 31.0 | 430 | 0.072 | 0.05 |
| 30 | (Ti0.2Cr0.1Al0.7)C0.5N0.5 | 28.0 | 420 | 0.067 | 0.08 |
| 31 | (Ti0.2Cr0.1Al0.7)C0.7N0.3 | 23.0 | 410 | 0.056 | 0.18 |
| 32 | (Ti0.4Al0.5V0.1)N | 27.0 | 450 | 0.060 | 0.097 |
| 33 | (Ti0.2Ta0.2Al0.55Si0.05)N | 30.0 | 420 | 0.071 | 0.06 |
| 34 | (Ti0.03Cr0.02Nb0.35Al0.6)N | 19.0 | 350 | 0.054 | 0.4 |

As shown in Table 1, Nos. 8 to 10, 12, 14 to 17, 19 to 30, 32, and 33 satisfied the requirements of the present invention and, therefore, had excellent erosion resistance.

On the other hand, as described below, Nos. 1 to 7, 11, 13, 18, 31, and 34 did not satisfy the requirements of the present invention and, therefore, had poor erosion resistance.

No. 1 did not contain Al, and the total amount of Ti and Cr was more than the upper limit value specified in the present invention because the amount of Ti was large, so that the ratio (H/E) was less than the lower limit value. In addition, nitrogen was not contained and, therefore, the hardness (H) was less than the lower limit value. Consequently, the erosion resistance was poor. No. 2 did not contain Al, and the total amount of Ti and Cr was more than the upper limit value specified in the present invention because the amount of Ti was large, so that the ratio (H/E) was less than the lower limit value. Consequently, the erosion resistance was poor.

No. 3 did not contain Al, and the total amount of Ti and Cr was more than the upper limit value specified in the present invention because the amount of Ti was large, so that the ratio (HIE) was less than the lower limit value. In addition, Al was not contained and, therefore, the hardness (H) was less than the lower limit value. Consequently, the erosion resistance was poor. Meanwhile, the N content was smaller than the preferable range and, therefore, the hardness (H) decreased easily. No. 4 did not contain Al, and the total amount of Ti and Cr was more than the upper limit value specified in the present invention because the amount of Cr was large, so that the ratio (H/E) was less than the lower limit value. In addition, Al was not contained and, therefore, the hardness (H) was less than the lower limit value. Consequently, the erosion resistance was poor. In this regard, the hardness was low when Cr was employed alone and, therefore, addition of Al is necessary.

No. 5 did not contain Al, and the total amount of Ti and Cr was more than the upper limit value, so that the ratio (H/E) was less than the lower limit value and the erosion resistance was poor. As for No. 6, the total amount of Ti and Cr was more than the upper limit value specified in the present invention because the amount of Ti was large. In addition, the amount of Al was less than the lower limit value and, therefore, the ratio (HIE) was less than the lower limit value and the erosion resistance was poor.

As for No. 7, the total amount of Ti and Cr was more than the upper limit value specified in the present invention because the amount of Ti was large. In addition, the amount of Al was less than the lower limit value and, therefore, the ratio (H/E) was less than the lower limit value and the erosion resistance was poor. As for No. 11, the amount of Al was more than the upper limit value and, therefore, the ratio (HIE) was less than the lower limit value and the erosion resistance was poor.

As for No. 13, the total amount of Ti and Cr was more than the upper limit value. In addition, the amount of Al was less than the lower limit value and, therefore, the ratio (H/E) was less than the lower limit value and the erosion resistance was poor. As for No. 18, the amount of Al was more than the upper limit value and, therefore, the ratio (H/E) was less than the lower limit value and the erosion resistance was poor. No. 31 contained C excessively, so that the hardness was reduced and, as a result, the ratio (H/E) was less than the lower limit value and the erosion resistance was poor. As for No. 34, the total amount of Ti and Cr was less than the lower limit value and, thereby, the hardness (H) and the ratio (H/E) were less than the lower limit value and the erosion resistance was poor.

Meanwhile, as is clear from the graph shown in FIG. 2, the erosion rate tends to become small as the ratio (H/E) increases.

Up to this point, the present invention has been explained in detail with reference to the embodiments and the examples. However, the gist of the present invention is not limited to the above-described contents and the scope of right is to be accorded the broadest interpretation on the basis of the description of the claims. In this regard, it is needless to say that the contents of the present invention can be, for example, modified and changed widely on the basis of those described above.

This application claims the benefit of Japanese Patent Application (Japanese Patent Application No. 2011-135401) filed on Jun. 17, 2011, which is hereby incorporated by reference herein in its entirety.

INDUSTRIAL APPLICABILITY

The present invention can be applied to a steam turbine blade, a jet engine compressor blade, a compressor screw for gas, liquid compression, a turbo compressor impeller, a fuel injection valve, parts of a pulverizer used in production of a ceramic powder through pulverization, and parts, e.g., a cylinder of a slurry pump, an agitation impeller, or casings to hold them, so as to improve the erosion resistance.

REFERENCE SIGNS LIST 2 substrate
10 film formation apparatus
11 chamber
12 arc evaporation source
13 arc power supply
14 bias power supply
15 gas feed opening
16 substrate stage
17 support table 18 heater
19 DC power supply for discharge
20 AC power supply for filament heating
21 filament

The invention claimed is:

1. A member covered with a hard coating, comprising:
a substrate for any one selected from the group consisting of a steam turbine blade, a jet engine compressor blade, a compressor screw for gas or liquid compression, a turbo compressor impeller, and a fuel injection valve and
a hard coating covering the substrate,
wherein
the hard coating has a hardness (H) of 20 GPa or more and a harness to Young's modulus ratio (H/E) of 0.06 or more, where the hardness and the Young's modulus are measured with a nano indenter, and
the hard coating has a composition of $(Ti_aCr_bAl_cSi_dB_eY_f)(C_xN_y)$, where a, b, c, d, e, f, x, and y represent atomic ratios and $0 \le a \le 0.6$, $0 \le b \le 0.6$, $0.4 \le c \le 0.7$, $0 \le d \le 0.15$, $0 \le e \le 0.1$, $0 \le f \le 0.05$, $0.1 \le a+b \le 0.6$, $a+b+c+d+e+f=1$, $0 < x \le 0.5$, $0.5 \le y \le 1$, and $x+y=1$, are satisfied.

2. The member according claim 1, wherein the hard coating comprises B and $0.05 \le e \le 0.1$.

3. The member according to claim 1, wherein the hard coating has a composition of $(Ti_aCr_bAl_cSi_d)(C_xN_y)$, where a, b, c, d, x, and y represent atomic ratios and $0 \le a \le 0.5$, $0 \le b \le 0.5$, $0.5 \le c \le 0.65$, $0 \le d \le 0.05$, $0.1 \le a+b \le 0.6$, $a+b+c+d=1$, $0 < x \le 0.2$, $0.8 \le y < 1$, and $x+y=1$, are satisfied.

4. A member covered with a hard coating, comprising:
a substrate for an apparatus to agitate, transport, or pulverize a powder or a fluid containing a powder and
a hard coating covering a sliding surface of the substrate to come into contact with the powder,
wherein
the hard coating has a hardness (H) of 20 GPa or more and a hardness to Young's modulus ratio (H/E) of 0.06 or more, where the hardness and the Young's modulus are measured with a nano indenter, and
the hard coating has a composition of $(Ti_aCr_bAl_cSi_dB_eY_f)(C_xN_y)$, where a, b, c, d, e, f, x, and y represent atomic ratios and $0 \le a \le 0.6$, $0 \le b \le 0.6$, $0.4 \le c \le 0.7$, $0 \le d \le 0.15$, $0 \le e \le 0.1$, $0 \le f \le 0.05$, $0.1 \le a+b \le 0.6$, $a+b+c+d+e+f=1$, $0 < x \le 0.5$, $0.5 \le y \le 1$, and $x+y=1$ are satisfied.

5. The member according to claim 4, wherein the hard coating has a composition of $(Ti_aCr_bAl_cSi_d)(C_xN_y)$, where a, b, c, d, x, and y represent atomic ratios and $0 \le a \le 0.5$, $0 \le b \le 0.5$, $0.5 \le c \le 0.65$, $0 \le d \le 0.05$, $0.1 \le a+b \le 0.6$, $a+b+c+d=1$, $0 < x \le 0.2$, $0.8 \le y < 1$, and $x+y=1$ are satisfied.

6. The member according claim 4, wherein the hard coating comprises B and $0.05 \le e \le 0.1$.

* * * * *